US006958646B1

(12) United States Patent
Colleran et al.

(10) Patent No.: US 6,958,646 B1
(45) Date of Patent: Oct. 25, 2005

(54) AUTOZEROING FLOATING-GATE AMPLIFIER

(75) Inventors: William T. Colleran, Seattle, WA (US); Todd E. Humes, Shoreline, WA (US); Christopher J. Diorio, Shoreline, WA (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 10/447,684

(22) Filed: May 28, 2003

Related U.S. Application Data

(60) Provisional application No. 60/383,995, filed on May 28, 2002.

(51) Int. Cl.[7] .................................................. H03F 1/02
(52) U.S. Cl. ............................................ 330/9; 330/86
(58) Field of Search .............................. 330/9, 86, 110; 327/124, 182, 284, 307

(56) References Cited

U.S. PATENT DOCUMENTS

| | | |
|---|---|---|
| 3,893,151 A | 7/1975 | Bosselaar et al. |
| 3,958,236 A | 5/1976 | Kelly |
| 4,163,947 A | 8/1979 | Weedon |
| 4,420,871 A | 12/1983 | Scheibe |
| 4,622,656 A | 11/1986 | Kamiya et al. |
| 4,783,783 A | 11/1988 | Nagai et al. |
| 4,822,750 A | 4/1989 | Perlegos et al. |
| 4,935,702 A | 6/1990 | Mead et al. |
| 4,953,908 A | 9/1990 | Dondlinger |
| 4,953,928 A | 9/1990 | Anderson et al. |
| 4,962,380 A | 10/1990 | Meadows |
| 5,059,920 A | 10/1991 | Anderson et al. |
| 5,068,622 A | 11/1991 | Mead et al. |
| 5,109,261 A * | 4/1992 | Mead et al. ................. 257/369 |
| 5,146,106 A | 9/1992 | Anderson et al. |
| 5,160,899 A | 11/1992 | Anderson et al. |
| 5,166,562 A | 11/1992 | Allen et al. |
| 5,177,697 A | 1/1993 | Schanen et al. |
| 5,331,215 A | 7/1994 | Allen et al. |
| 5,336,936 A | 8/1994 | Allen et al. |
| 5,345,418 A | 9/1994 | Challa |
| 5,376,813 A | 12/1994 | Delbruck et al. |
| 5,463,348 A | 10/1995 | Sarpeshkar et al. |
| 5,541,878 A | 7/1996 | LeMoncheck et al. |
| 5,627,392 A | 5/1997 | Diorio et al. |
| 5,687,118 A | 11/1997 | Chang |
| 5,734,288 A | 3/1998 | Dolazza et al. |
| 5,757,219 A | 5/1998 | Weedon et al. |
| 5,763,912 A | 6/1998 | Parat et al. |
| 5,773,997 A | 6/1998 | Stiegler |

(Continued)

FOREIGN PATENT DOCUMENTS

EP         0 298 618        1/1989

OTHER PUBLICATIONS

Hasler, et al., "An autozeroing Floating-Gate Amplifier", IEEE Transactions on Circuits and Systems, Analog and Digital Signal Processing, vol. 48, No. 1, Jan. 2001, pp. 74-82.

(Continued)

*Primary Examiner*—Henry Choe
(74) *Attorney, Agent, or Firm*—Thelen Reid & Priest; David B. Ritchie

(57) ABSTRACT

An autozeroing floating-gate amplifier (AFGA) is implemented utilizing a programmable gain element, the characteristics of which may be changed by changing the amount of charge stored on a floating gate device.

17 Claims, 15 Drawing Sheets

U.S. PATENT DOCUMENTS

| | | | |
|---|---|---|---|
| 5,777,361 A | | 7/1998 | Parris et al. |
| 5,801,567 A | * | 9/1998 | Kosiec .................. 327/263 |
| 5,875,126 A | | 2/1999 | Minch et al. |
| 5,933,039 A | | 8/1999 | Hui et al. |
| 5,939,945 A | | 8/1999 | Thewes et al. |
| 5,986,927 A | * | 11/1999 | Minch et al. .......... 365/185.01 |
| 6,134,182 A | | 10/2000 | Pilo et al. |
| 6,320,788 B1 | | 11/2001 | Sansbury et al. |
| 6,664,909 B1 | | 12/2003 | Hyde et al. |

OTHER PUBLICATIONS

L. Richard Carley, "Trimming Analog Circuits Using Floating-Gate Analog MOS Memory", IEEE Journal of Solid-State Circuits 24, No. 6, Dec. 1989, pp. 1569-1575.

Partial International Search for International Application No. PCT/US03/31792, date mailed Apr. 2, 2004.

Diorio, et al., "A High-Resolution Non-Volatile Analog Memory Cell", IEEE, 1995, pp. 2233-2236.

Gray, et al., "Analysis and Design of Analog Integrated Circuits", Second Edition, University of California, Berkeley, 1984, pp. 66-71.

Hasler, et al., "An Autozeroing Amplifier Using PFET Hot-Electron Injection", IEEE, 1996.

Hasler, et al., "Single Transistor Learning Synapses", Cambridge, MA, The MIT Press, 1995, pp. 817-824.

Hasler, et al., "Single Transistor Learning Synapse with Long Term Storage", IEEE, 1995, pp. 1660-1663.

Hochet, et al., "Implementation of a Learning Kohonen Neuron Based on a New Multilevel Storage Technique", IEEE Journal of Solid-State Circuits, vol. 26, No. 3, Mar. 1991, pp. 262-267.

Hollis, et al., "A Neural Network Learning Algorithm Tailored for VLSI Implementation", IEEE Transactions on Neural Networks, vol. 5, No. 5, Sep. 1994, pp. 784-791.

Hu, et al., "Hot-Electron-Induced MOSFET Degradation-Model, Monitor, and Improvement", IEEE Transactions on Electron Devices, vol. ED-32, No. 2, Feb. 1985, pp. 375-385.

Ismail, et al., "Neural Information Processing II", Analog VLSI Signal and Information Processing, 1994, pp. 358-413.

R. Colin Johnson, "Neural Team Bares Silicon Brain", Electronic Engineering Times, Jul. 3, 1995, pp. 30-31.

R. Colin Johnson, "Mead Envisions New Design Era", Electronic Engineering Times, Jul. 17, 1995, p. 1, 37 and 38.

Lazzaro, et al., "Winner-Take-All Networks of O(N) Complexity", 1989, pp. 703-711.

Lazzaro, et al., "Systems Technologies for Silicon Auditory Models", IEEE, Jun. 1994, pp. 7-15.

Leblebici, et al., "Hot-Carrier Reliability of MOS VLSI Circuits", University of Illinois, Oxide Degradation Mechanisms, 1993, pp. 46-49.

Mead, et al., "MOS Devices and Circuits", Introduction to VLSI Systems, 1980, pp. 1-5.

Mead, "Differentiators", Analog VLSI and Neural Systems, Chapter 10, 1989, pp. 163-173.

Minch, et al., "A vMOS Soft-Maximum Current Mirror", Computation and Neural Systems, IEEE, 1995, pp. 2249-2252.

Minch, et al., "Translinear Circuits Using Subthreshold Floating-Gate MOS Transistors", Analog Integrated Circuits and Signal Processing, 9, 1996, pp. 167-179.

Sanchez, "Review of Carrier Injection in the Silicon/Silicon-Dioxide System", IEE Proceedings-G, vol. 138, No. 3, Jun. 1991, pp. 377-389.

Sarpeshkar, et al., "White Noise in MOS Transistors and Resistors", Circuits and Devices, IEEE, Nov. 1993, pp. 23-29.

Sarpeshkar, et al., "A Low-Power Wide-Linear-Range Transconductance Amplifier", Analog Integrated Circuits and Signal Processing, vol. 13, No. 1-2, May-Jun. 1997, pp. 123-151.

Tsividis, et al., "Continuous-Time MOSFET-C Filters in VLSI", IEEE Transactions on Circuits and Systems, vol. CAS-33, No. 2, Feb. 1986, pp. 125-140.

Vittoz, "Dynamic Analog Techniques", Design of MOS VLSI Circuits for Telecommunications, 1985, pp. 145-170.

* cited by examiner ness used in FIG. 1 typically requires that $V_{tun}$ be in excess
AUTOZEROING FLOATING-GATE AMPLIFIER

RELATED CASES

This application claims priority based upon co-pending U.S. Provisional Patent Application Ser. No. 60/383,995 filed on May 28, 2002 in the name of inventors Todd E. Humes and Christopher J. Diorio and commonly owned herewith.

FIELD OF THE INVENTION

The present invention is directed to the field of autozeroing floating-gate amplifiers (AFGAs). An AFGA is an integrated continuous-time filter that is intrinsically autozeroing. More particularly, the invention is directed to methods and apparati for implementing an improved AFGA having an adaptive quiescent bias point.

BACKGROUND OF THE INVENTION

DC blocking capacitors are often used to eliminate DC offsets into analog circuits. The capacitance value and the resistance of the input set the low frequency cutoff of the composite circuit. In order to obtain a time constant on the order of a millisecond or longer, prohibitively large capacitors are required which are not easily capable of being integrated into CMOS integrated circuits. U.S. Pat. No. 5,875,126, by Minch, et. al, describes an AFGA using a CMOS inverter as a gain element. An electrical schematic diagram of this prior art AFGA 10 is provided at FIG. 1. pFET impact ionized hot electron injection ("IHEI") is the mechanism used at transistor 12 to inject electrons onto floating gate 14. A tunneling junction 16 tunnels electrons off of floating gate 14 using Fowler-Nordheim tunneling. In the circuit illustrated in FIG. 1, an open-loop inverting amplifier (inverter) includes pFET input transistor 12 and nFET current source 18 which sets the current through pFET 12. With capacitive feedback, the input signal at node $V_{in}$ is amplified by a closed-loop gain approximately equal to $-C1/C2$ where C1 is the capacitance of capacitor $C_1$ and $C_2$ is the capacitance of capacitor $C_2$. The maximum gain is limited both by the open-loop gain of the inverter and by the parasitic floating-gate-to-drain overlap capacitance of the inverter.

The complementary tunneling and IHEI processes adjust the floating-gate charge in such a way that the amplifier's output voltage returns to a steady-state value on a slow time scale (on the order of milliseconds to minutes or longer) when the injection current is equal to the tunneling current. If the output voltage is below its equilibrium value, then the injection current exceeds the tunneling current, decreasing the charge on the floating gate; that, in turn, increases the output voltage back toward its equilibrium value. If the output voltage is above its equilibrium value, then the tunneling current exceeds the injection current, increasing the charge on the floating gate; that, in turn, decreases the output voltage back toward its equilibrium value. If the output voltage is equal to its equilibrium value, then the tunneling current and the injection current are the same and the charge on the floating gate stays the same. The circuit behaves like a high-pass filter with a long ($\geq 1$ millisecond) time constant. This time constant may be set to be arbitrarily long (e.g., minutes, hours, days, etc.) and may readily be implemented in a CMOS integrated circuit.

FIG. 2 is a voltage versus time plot of the performance of an AFGA in accordance with the circuit of FIG. 1. As can be seen in FIG. 2 at "A", a step decrease in the $V_{in}$ signal results in a downward adaptation of the $V_{out}$ signal. This adaptation rate is controlled by the tunneling process. At "B", a step increase in the $V_{in}$ signal results in an upward adaptation of the $V_{out}$ signal. This adaptation rate is controlled by the IHEI process and does not match the adaptation rate of the tunneling process. Thus, in this implementation, positive adaptation does not match negative adaptation.

The circuit of FIG. 1 represents a relatively simple circuit. It implements a single gain stage which thus limits the ability to control the voltage on the floating gate. Performance is also limited in that the mechanisms used to raise and lower the charge on the floating gate are not the same and exhibit different time constants. For example, the output bias voltage rises according to the dynamics of the IHEI process and it falls according to the different dynamics of the tunneling process. The Fowler-Nordheim tunneling mechanism used in FIG. 1 typically requires that $V_{tun}$ be in excess of about 10 Volts whereas the typical CMOS supply voltage is less than about 3 Volts. The implementation is a single-ended, single input, inverting configuration.

The feedback path in CMOS integrated amplifiers typically uses resistors. The resistors can take the form of physical resistive elements, or can take the form of switched capacitors. Physical resistors provide continuous-time feedback and thereby allow the construction of wideband amplifiers, but the resistance of such resistors is typically relatively small so that amplifiers that use them consume relatively high power. The resistance value of switched capacitors can be large, solving the power problem, but the amplifier bandwidth is limited by the capacitor switching frequency (and does not typically exceed ⅕ of the capacitor switching frequency). A mechanism for capacitive feedback without switching is therefore desired, one which utilizes low power and achieves continuous-time wideband operation. Similarly, improved performance through matched time constants, multiple gain stages, relaxed voltage requirements, multiple inputs, differential operation and/or non-inverting architecture is desirable.

BRIEF DESCRIPTION OF THE INVENTION

An autozeroing floating-gate amplifier (AFGA) is implemented utilizing a programmable gain element, the characteristics of which may be changed by changing the amount of charge stored on a floating gate device.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
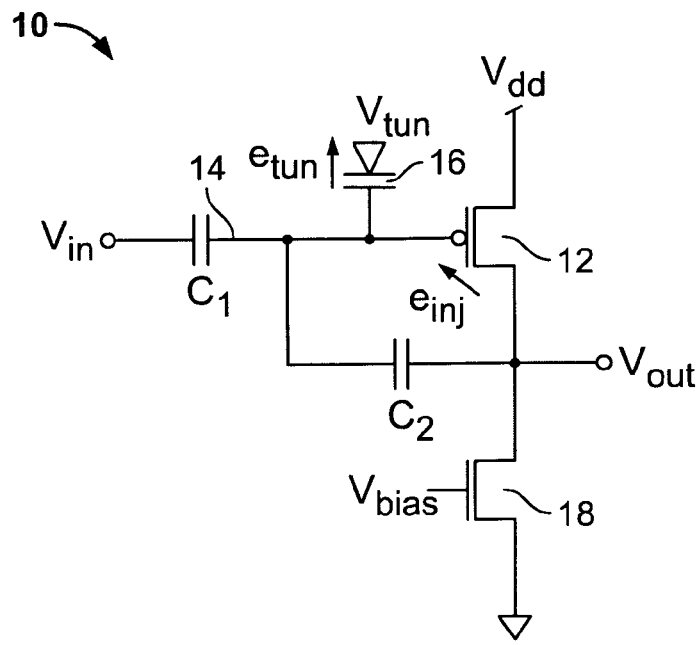
FIG. 1 is an electrical schematic diagram of an autozeroing floating-gate amplifier in accordance with the prior art.
Figure 2:
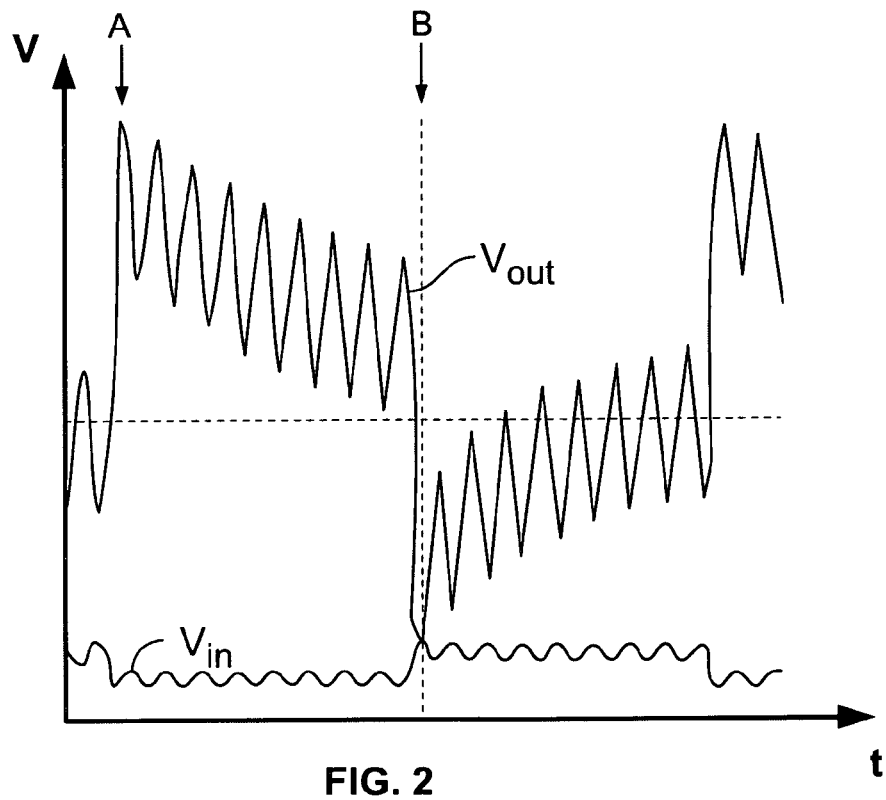
FIG. 2 is a plot of voltage versus time for the performance characteristics of an autozeroing floating-gate amplifier in accordance with that of FIG. 1.

Embodiments of the present invention are described herein in the context of an autozeroing floating-gate amplifier having a programmable gain element. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In this description of the invention all of the drawings are based upon a contemporary CMOS logic process with a p- type substrate. Those of ordinary skill in the art will also realize that the conductivity types could be reversed and an n- type substrate used, with n- wells changed to p- wells and the like. Those of ordinary skill in the art will also realize that insulating substrates with both n-type and p-type wells could be used, or substrates made from a material other than silicon. p- (and n-) substrates are doped with p-type (and n-type) dopants in a range of about $10^{15}$ to about $10^{18}$ dopants per cubic centimeter. p- (and n-) wells are doped with corresponding dopants in a range of about $10^{15}$ to about $10^{18}$ dopants per cubic centimeter. p+ and n+ regions are doped with corresponding dopants in a range of about $10^{18}$ to about $10^{21}$ dopants per cubic centimeter. The techniques used to fabricate the structures described herein are all commercially available from commercial fabricators producing logic CMOS integrated circuits and hence are well within the skill of those of ordinary skill in the art.

Conductive elements may be made of metal, silicide or heavily doped (on the order of about $10^{21}$ dopants per cubic centimeter) polycrystalline silicon (poly or polysilicon herein). While silicon dioxide ($SiO_2$) is contemplated to be a common dielectric for use as the insulator in isolating the floating gates of the present invention from each other and from the substrate and its wells, other insulator materials may be used alone, or in combination with $SiO_2$. Insulators may be formed from silicon dioxide, nitrided oxide, nitride, oxide/nitride composite, titanium oxide, tantalum oxide, zirconium oxide, hafnium oxide, lanthanum oxide (or any oxide of a lanthanide), titanium silicate, tantalum silicate, zirconium silicate, hafnium silicate and lanthanum silicate (or any silicate of a lanthanide), any combination of the above dielectrics, or other insulating materials as are known or as may become known to those skilled in the art. For insulators formed from silicon dioxide, thicknesses in the range of about 70 Å to about 200 Å are typical for non-volatile charge storage, whereas thicknesses in the range of about 10 Å to about 50 Å are typical for pseudo-nonvolatile charge storage. Other insulator materials will have different thickness values. Accordingly, additional fabrication details will not be recited herein except where deemed important to the disclosure in order to avoid overcomplicating the disclosure.

Figure 3:
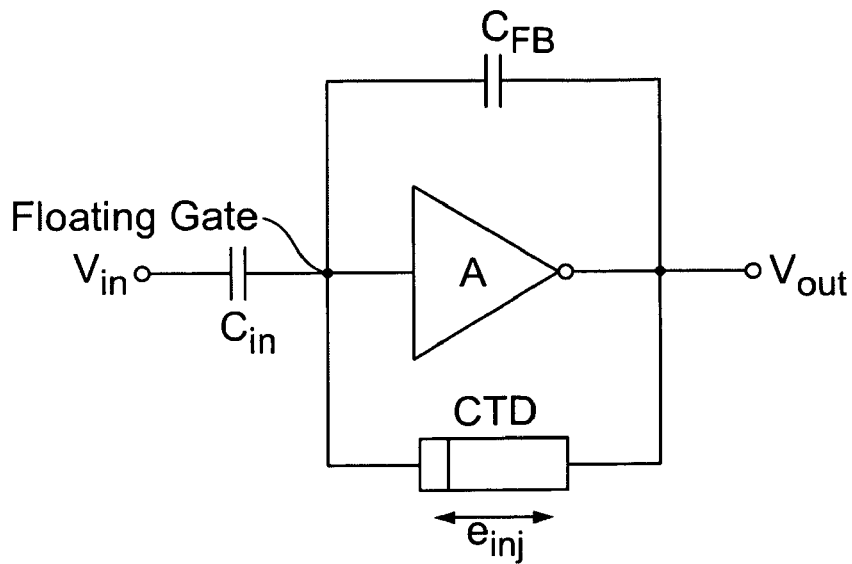
FIG. 3 is an idealized electrical schematic diagram of an AFGA in accordance with an embodiment of the present invention.

FIG. 3 is an idealized electrical schematic diagram illustrating an autozeroing floating-gate amplifier implemented in accordance with one embodiment of the present invention. In accordance with this embodiment there are four basic components. These are a capacitive input denoted $C_{in}$, a feedback capacitor denoted $C_{FB}$, an amplifier denoted A, and one or more charge transfer devices denoted CTD. The capacitors are formed in conventional ways well known to those of ordinary skill in the art. The amplifier is, in this case, an inverting amplifier, and may be an operational amplifier, operational transconductance amplifier (OTA), a CMOS inverter, or the like and it may be single ended (as shown) or differential. The CTD controls the floating-gate charge and voltage. It may be constructed to be bi-directional thus eliminating the mismatch between positive and negative adaptation. In this configuration it either adds charge or removes charge but does not do both simultaneously. At equilibrium, $e_{inj}=0$. Using direct tunneling as the charge transfer mechanism, rather than Fowler-Nordheim tunneling, eliminates the need for relatively high control voltages. Note that the OTA is a very well known circuit. See, e.g., Carver Mead, *Analog VLSI and Neural Systems*, Reading, Mass., Addison-Wesley, Inc., 1989, and Paul R. Gray, Paul J. Hurst, Stephen H. Lewis and Robert G. Meyer, *Analysis and Design of Analog Integrated Circuits*, 4th Edition, John Wiley & Sons, Inc., New York, 2001.

The Charge Transfer Devices (CTDs) referred to above control the charge on the insulated AFGA floating node (denoted "i" for insulating terminal in FIGS. 4A, 4B, 4C, 4D and 4E) in response to a signal on the control terminal (similarly denoted "c" for control terminal). Electrons are transferred to or from the floating node by means of various charge transfer mechanisms such as IHEI (impact ionized hot electron injection) and Fowler-Nordheim (FN) tunneling as described in U.S. Pat. No. 5,990,512 to Diorio et al. as well as Frenkel-Poole (FP) tunneling and direct tunneling. Direct tunneling has recently become a desirable mechanism for charge transfer in CMOS devices as it is possible at voltages within the power supply rails for CMOS devices in silicon dioxide layers of less than about 50 Å.

Figure 4A:
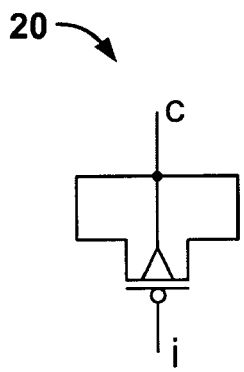
FIGS. 4A, 4B and 4D are electrical schematic diagrams of charge transfer devices in accordance with various embodiments of the present invention.
Figure 4B:
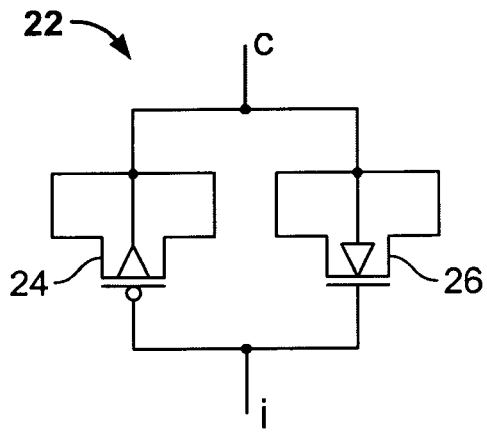
Figure 4C:
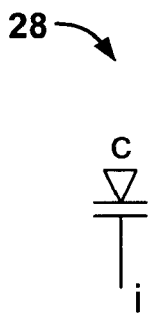
FIGS. 4C and 4E are electrical schematic diagram symbols representative of charge transfer devices as used in the present invention.
Figure 4D:
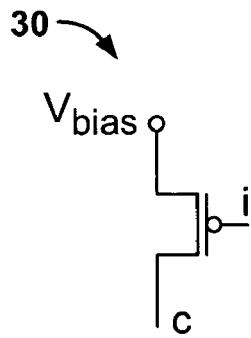
Figure 4E:
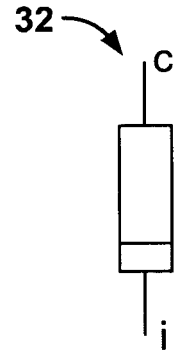

The CTD 20 illustrated in FIG. 4A is a pFET (p-channel field effect transistor) having its source, drain and well shorted together to form a capacitor between the insulating terminal i and the control terminal c. The CTD 22 illustrated in FIG. 4B is a symmetric tunneling junction having a pFET 24 with its source, drain and well shorted together disposed in parallel with an nFET 26 with its source, drain and well shorted together. The coupled gates of the pFET 24 and nFET 26 form the insulating terminal i of the CTD, and the coupled source/drain regions of the FETs form the control terminal c of the CTD. FIG. 4C illustrates a symbolic representation 28 for a tunneling junction in accordance with this invention. FIG. 4D illustrates a pFET 30 configured for IHEI. Electrons are injected onto the insulating terminal i in response to a signal on drain c. Bias voltage $V_{bias}$ is applied at the source of pFET 30. FIG. 4E illustrates a symbolic representation 32 for a generic CTD.

Figure 5A:
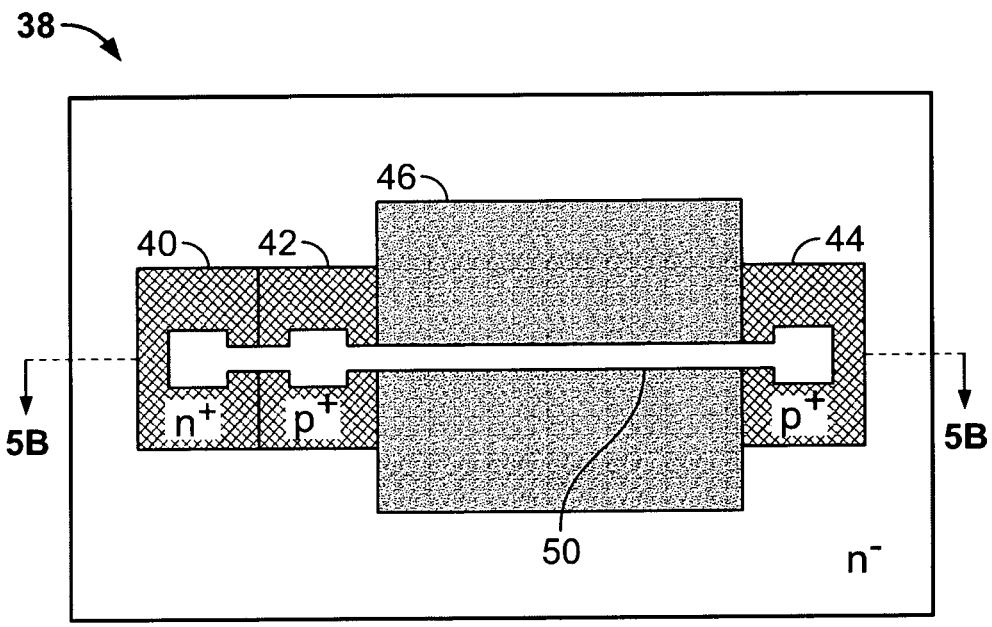
FIG. 5A is a layout view of a pFET tunneling junction charge transfer device in accordance with one embodiment of the present invention.
Figure 5B:
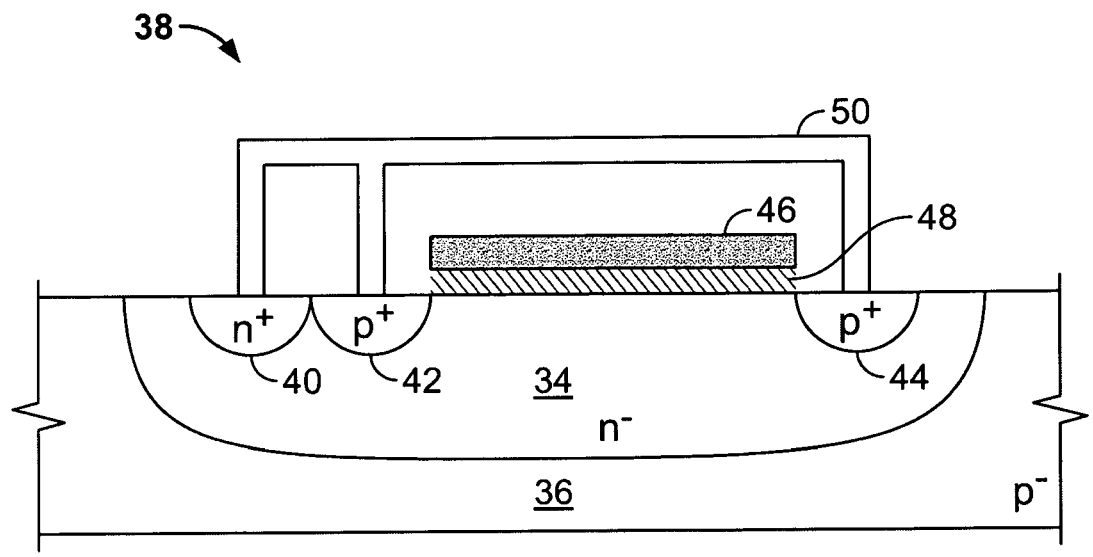
FIG. 5B is a cross sectional view taken along line 5B—5B of FIG. 5A.
Figure 5C:
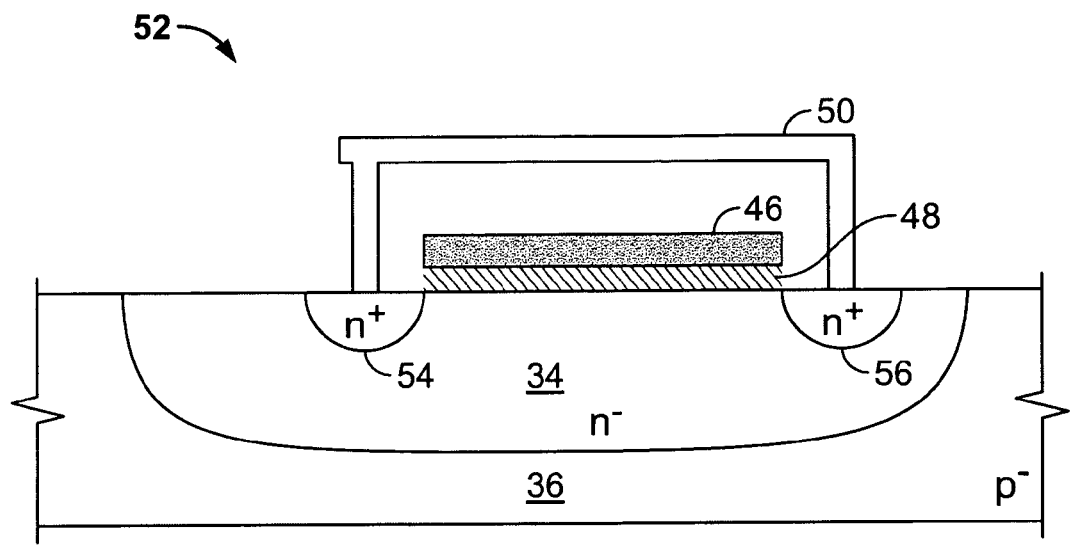
FIG. 5C is a cross sectional view of an n-well bulk nFET tunneling junction charge transfer device in accordance with one embodiment of the present invention.
Figure 5D:
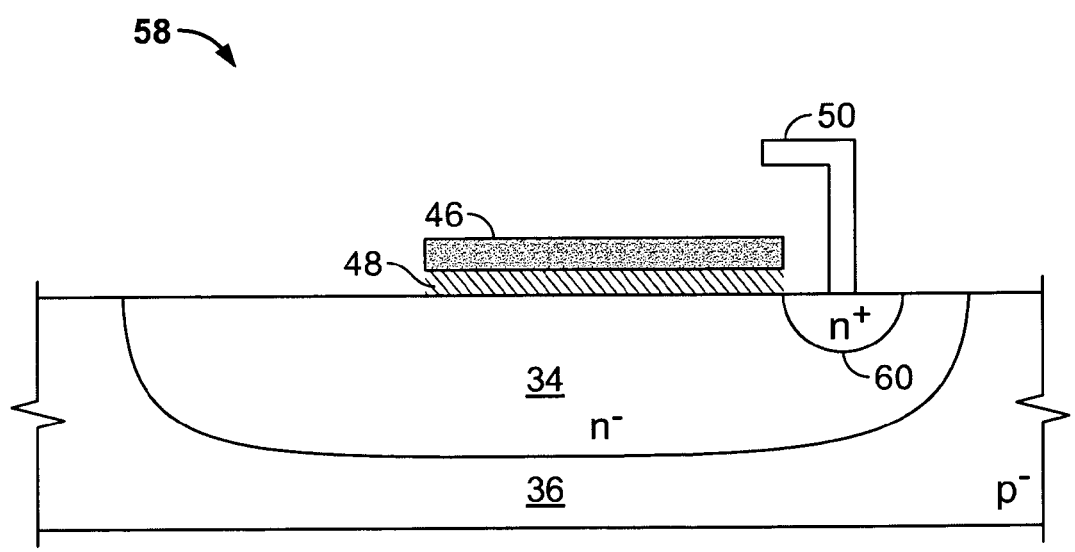
FIG. 5D is a cross sectional view of a MOSCAP type tunneling junction charge transfer device in accordance with one embodiment of the present invention.

The CTDs may be fabricated in a number of ways. For example, in FIGS. 5A and 5B, a pFET tunneling junction is illustrated. FIG. 5A is a layout (top) view of the pFET tunneling junction and FIG. 5B is a cross sectional view thereof taken along line 5B—5B of FIG. 5A. As can be seen, the device is disposed in an n– well 34 disposed in p– substrate 36. The pFET tunneling junction device 38 includes an n+ well contact region 40 and a source p+ region 42 and a drain p+ region 44. Floating gate 46 sits above the channel formed between the source and drain and is separated from the channel by a dielectric layer 48 such as silicon dioxide. The well contact, source and drain are shorted together by conductor 50 which may be formed of any suitable conductive material. Turning now to FIG. 5C an nFET tunneling junction device 52 is illustrated in cross sectional view. In this embodiment an n– well 34 is disposed in a p– substrate 36. Within the n– well 34 are a pair of n+ regions 54 and 56 which form the transistor's source and drain. These are shorted to one another by conductor 50 as described above. As above, floating gate 46 sits above the channel formed between the source and drain and is separated from the channel by a dielectric layer 48 such as silicon dioxide. Turning now to FIG. 5D a MOSCAP tunneling junction device 58 is illustrated in cross sectional view. In this embodiment an n– well 34 is disposed in a p– substrate 36. Within the n– well 34 is an n+ region 60 which is coupled to conductor 50. The rest of the details of the device are as described above. It is also possible to use a heavily doped MOSCAP, often called a linear capacitor in the art, as well as tunneling between first and second conductive layers such as first and second polysilicon layers.

Figure 6:
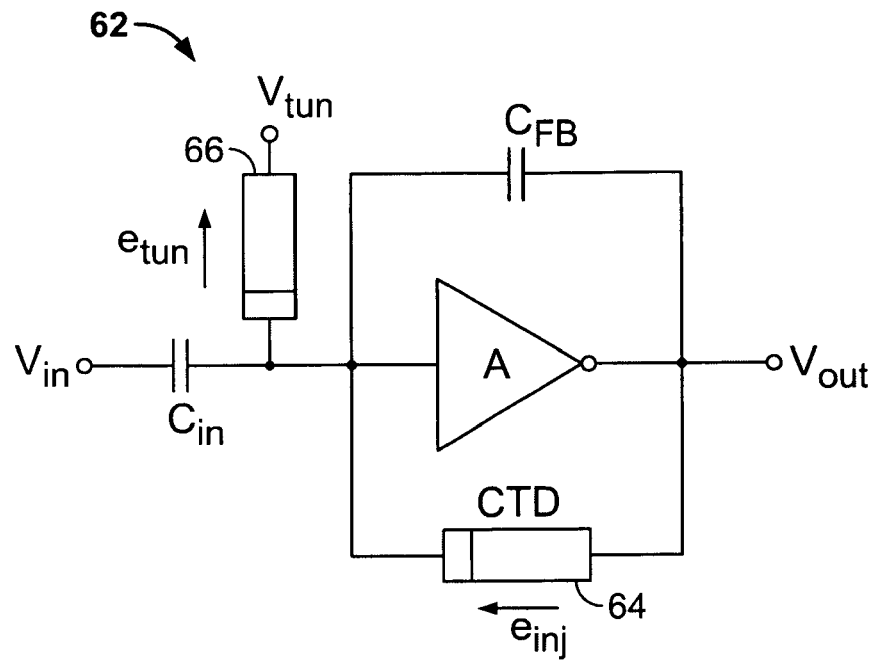
FIGS. 6–9 and 11–26 are electrical schematic diagrams of various AFGAs in accordance with embodiments of the present invention.

Turning now to FIG. 6, another embodiment 62 of the present invention is illustrated. The embodiment of FIG. 6 differs from that of FIG. 3 in that separate injection 64 and tunneling devices 66 are provided. Devices 64 and 66 may be matched or not, as desired.

Figure 7:
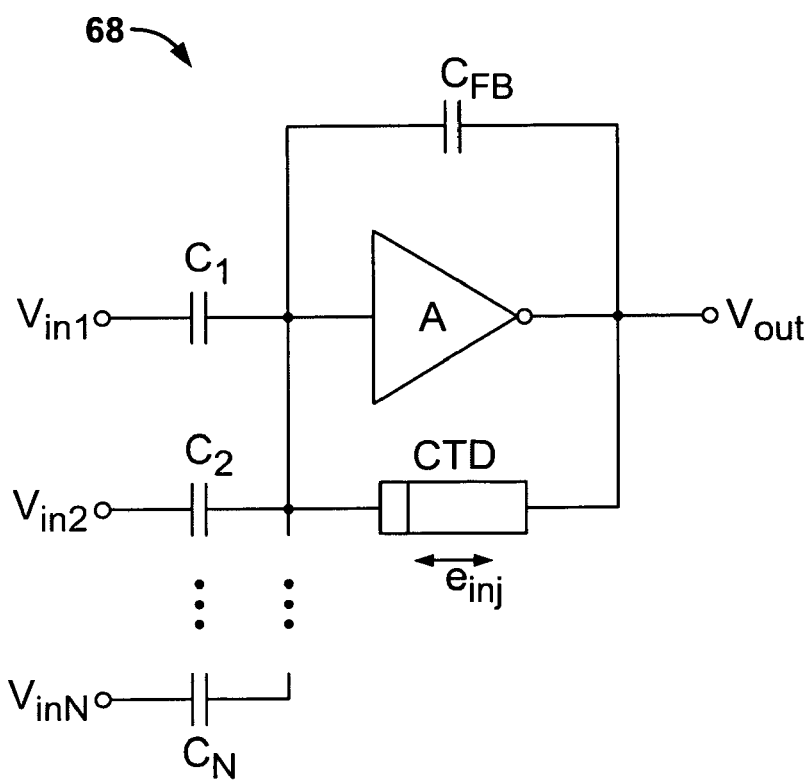

Turning now to FIG. 7, another embodiment 68 of the present invention is illustrated. The embodiment of FIG. 7 differs from that of FIG. 3 in that a plurality N of input nodes $V_{in1}, V_{in2}, \ldots, V_{inN}$ are provided and capacitively coupled to the circuit through capacitors $C_1, C_2, \ldots, C_N$.

Figure 8:
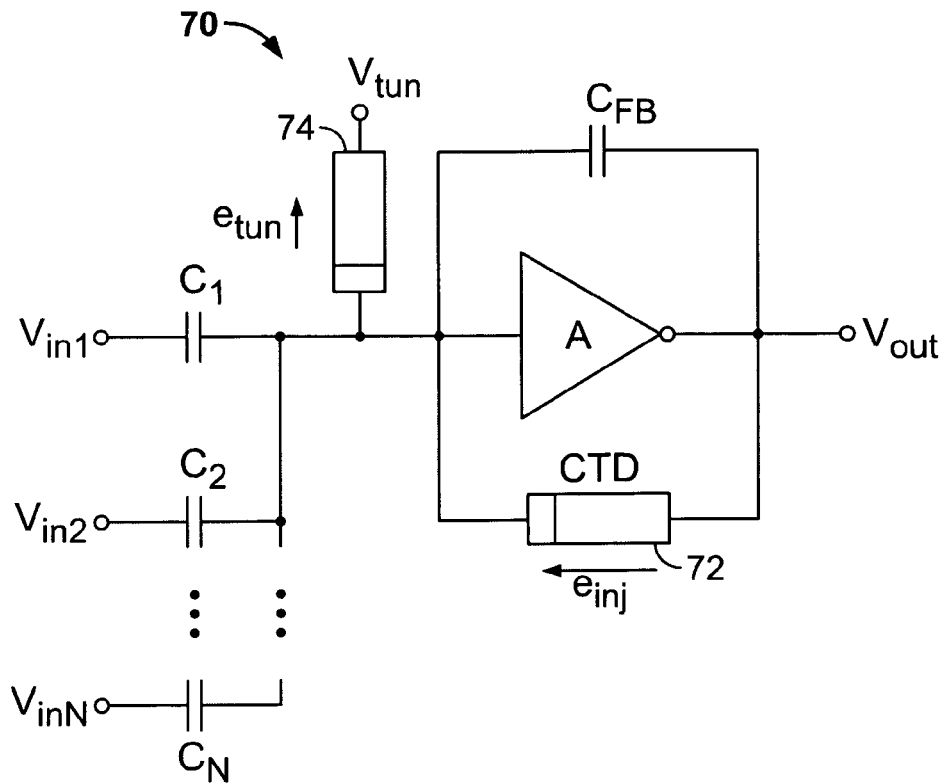

Turning now to FIG. 8, another embodiment 70 of the present invention is illustrated. The embodiment of FIG. 8 differs from that of FIG. 7 in that separate injection 72 and tunneling devices 74 are provided. Devices 72 and 74 may be matched or not, as desired.

Figure 9:
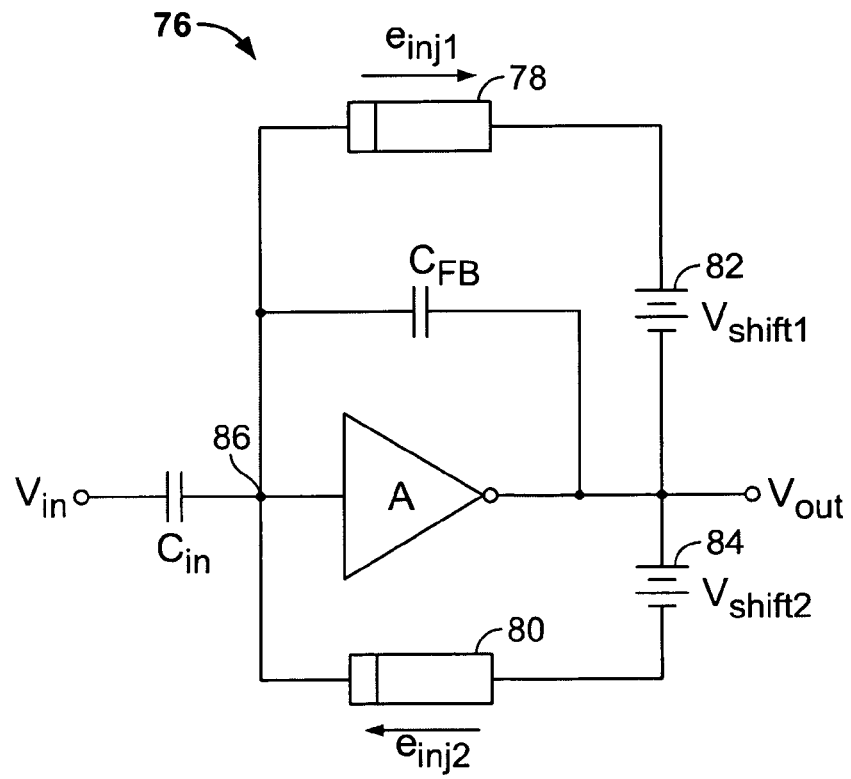
Figure 10:
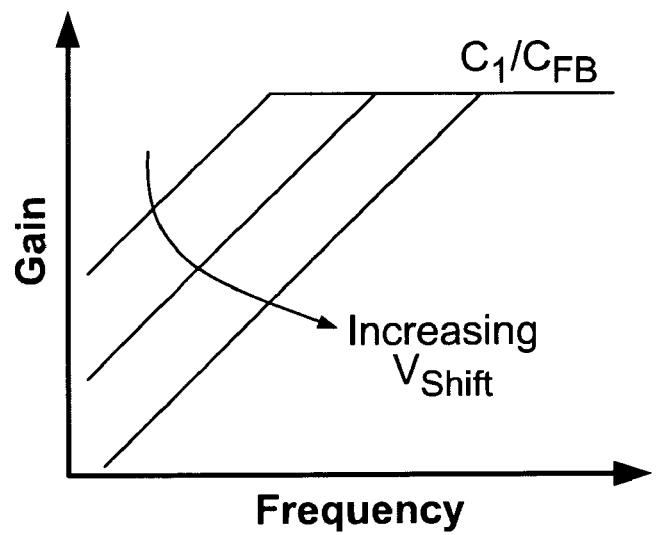
FIG. 10 is a plot of gain versus frequency response for an AFGA like that illustrated in FIG. 9.

Turning now to FIG. 9, another embodiment 76 of the present invention is illustrated. In accordance with the embodiment of FIG. 9, a pair of matched but oppositely directed CTDs 78, 80 are used, each with one end held off of the $V_{out}$ node by a level shifter 82, 84, respectively. These matched CTDs cause matched positive and negative adaptation and are adapted to simultaneously add charge to and remove charge from the floating gate node 86. At equilibrium, $e_{inj1}=e_{inj2}$. The level shifters 82, 84 are used to control the equilibrium magnitude of $e_{inj1}$ and $e_{inj2}$. The magnitude of $e_{inj}$ determines the low frequency corner of the AFGA frequency response as shown in FIG. 10. Direct tunneling CTDs eliminate the need for high voltage shifting. Level shifters 82 and 84 can be implemented using a variety of circuits familiar to those skilled in the art. For example, the positive voltage shift 82 can be implemented with a simple pFET source follower circuit. Similarly, the negative voltage shift 84 can be implemented with an nFET source follower circuit. Source followers are very well known circuits described in Paul R. Gray, Paul J. Hurst, Stephen H. Lewis and Robert G. Meyer, *Analysis and Design of Analog Integrated Circuits, 4th Edition*, John Wiley & Sons, Inc., New York, 2001.

FIG. 10 is a plot of gain versus frequency response for an AFGA like that illustrated in FIG. 9. Increasing amounts of level shifting move the curve to the right.

Figure 11:
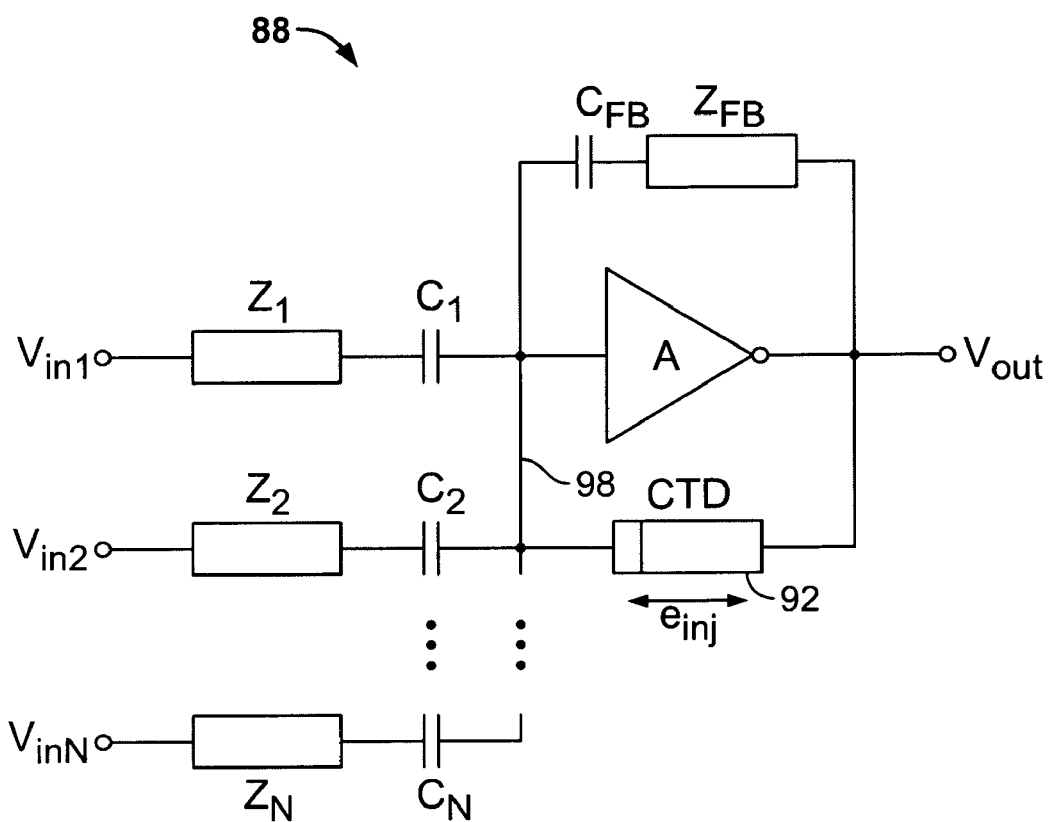

Turning now to FIG. 11, another embodiment 88 of the present invention is illustrated. The embodiment of FIG. 11 is a multi-input AFGA with impedance elements $Z_1, Z_2, \ldots, Z_N$ disposed in series with each input capacitor ($C_1, C_2, \ldots, C_N$) and impedance $Z_{FB}$ disposed in series with feedback capacitor $C_{FB}$. The transfer function $V_{out}/V_{inx}$ has a frequency response H(s) determined by $Z_{FB}$ and Zx as follows:

$$H(s)=-(1/sC_{FB}+Z_{FB}(s))/(1/sCx+Zx(s))$$

The impedance elements $Z_1, Z_2, \ldots, Z_N$ are implemented with conventional resistors, capacitors, inductors, transformers, and the like, and can be implemented in CMOS or off-chip as will now be apparent to those of ordinary skill in the art. This approach allows various types of frequency responsive circuits to be fabricated, such as high pass circuits, low pass circuits, band pass circuits and band stop circuits.

Figure 12:
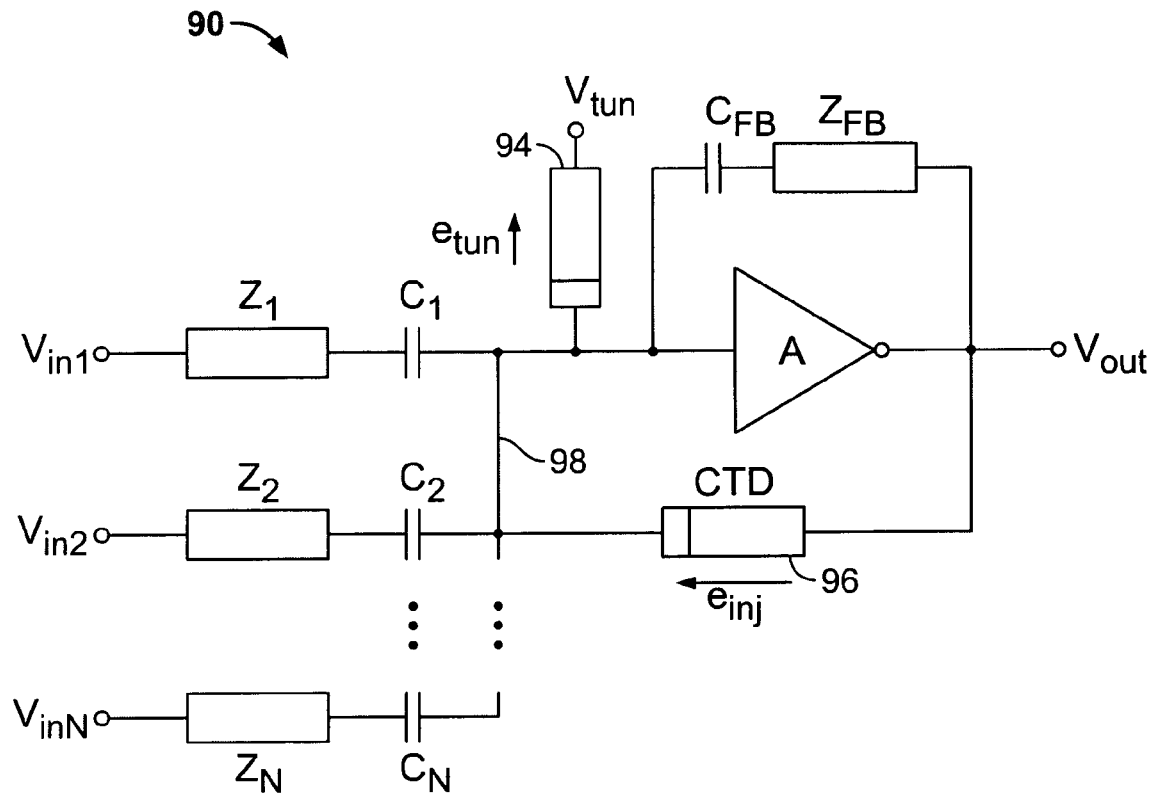

Turning now to FIG. 12, another embodiment 90 of the present invention is illustrated. This embodiment differs from that of FIG. 11 in that separate CTDs 94 and 96 are used to independently add and remove charge from the floating node 98 whereas in FIG. 11 a single bi-directional CTD 92 is used.

Figure 13:
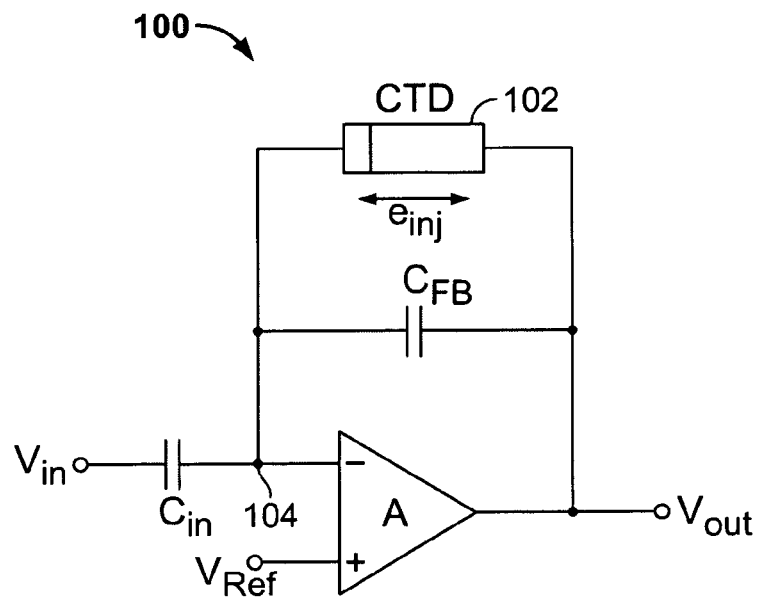

Turning now to FIG. 13, another embodiment 100 of the present invention is illustrated. In this embodiment (which is a slight variation on that of FIG. 3) a bi-directional CTD 102 is disposed between floating node 104 and the $V_{out}$ node. In parallel with CTD 102 is a feedback capacitor $C_{FB}$. $C_{in}$ is the input capacitor disposed between the $V_{in}$ node and floating node 104. The amplifier is a dual input type with the non-inverting input coupled to a reference voltage $V_{Ref}$ and the inverting input coupled to the floating node. The amplifier must have an insulating input. The action of the feedback forms a virtual ground at the floating gate node 104 so that the equilibrium voltage is equal to $V_{Ref}$. The virtual ground allows for well controlled behavior of the bi-directional CTD. This single-ended inverting embodiment implements the relationship $V_{out}/V_{in}=-C_{in}/C_{FB}$. Note that in each case shown and described herein the signal taken from the floating node and processed by the gain element must be inverted by the gain element or another element prior to feedback to the floating node of the AFGA. This avoids an undesirable positive feedback condition.

Figure 14:
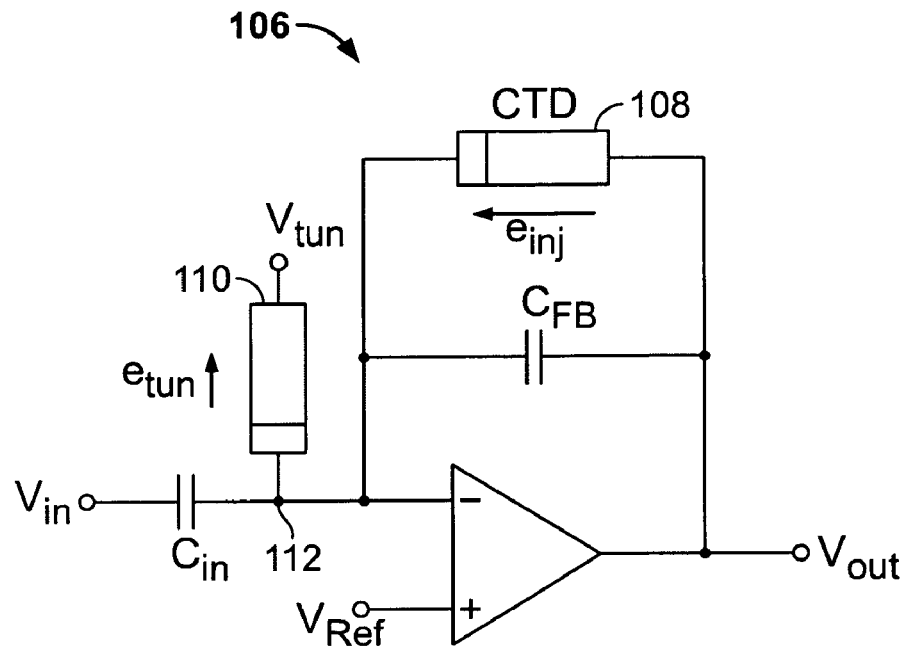

Turning now to FIG. 14, a modification 106 of the embodiment of FIG. 13 utilizes a pair of CTDs 108 as an injector and 110 as a tunneling device to add and remove electrons, respectively, from floating node 112. This single-ended, inverting embodiment implements the relationship $V_{out}/V_{in}=-C_{in}/C_{FB}$.

Figure 15:
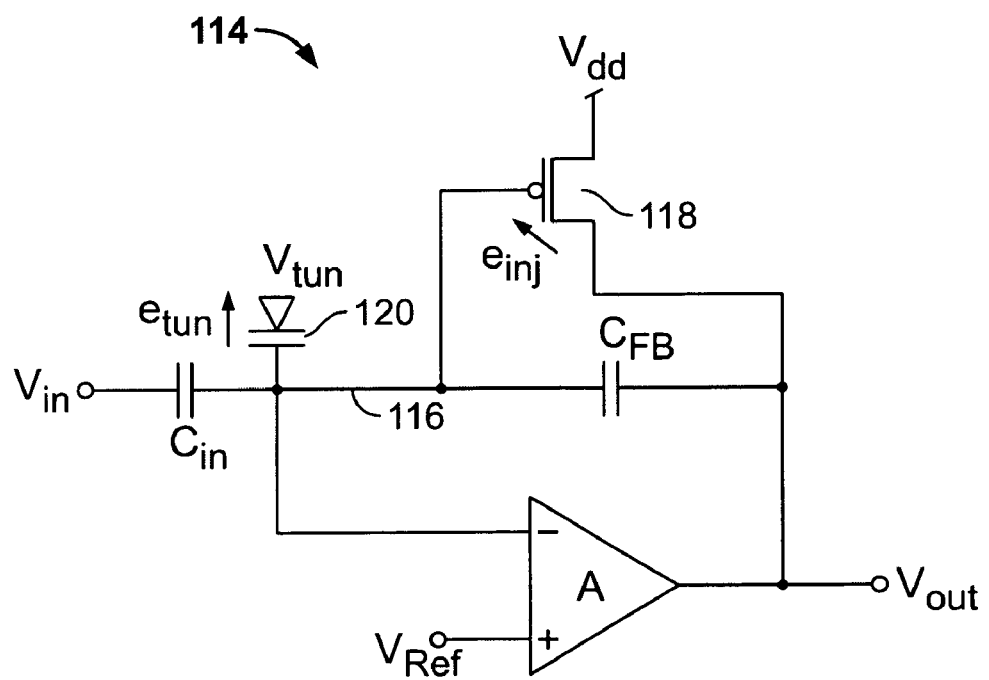

Turning now to FIG. 15, a specific implementation 114 of the circuit of FIG. 14 is illustrated. In this single-ended, inverting embodiment, $V_{out}/V_{in}=-C_{in}/C_{FB}$. The gain element A is an operational amplifier. Electrons are added to floating node 116 with pFET transistor 118 using IHEI as the injection mechanism. Electrons are removed from floating node 116 through tunneling across tunneling device 120 which may implement any appropriate form of tunneling. In equilibrium, $e_{tun}=e_{inj}$.

Figure 16:
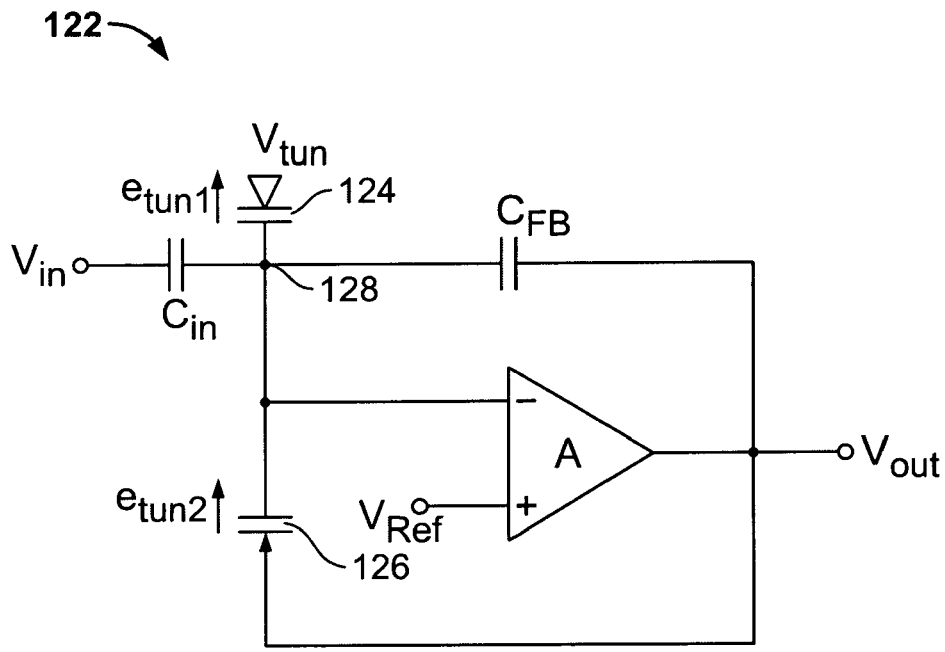

Turning now to FIG. 16, another specific implementation 122 is illustrated. In this single-ended inverting embodiment, $V_{out}/V_{in}=-C_{in}/C_{FB}$. The gain element A here is also an operational amplifier. A pair of unidirectional CTDs 124, 126 are used respectively to remove and add electrons from/to floating gate 128. In equilibrium, $e_{tun1}=e_{tun2}$.

Figure 17:
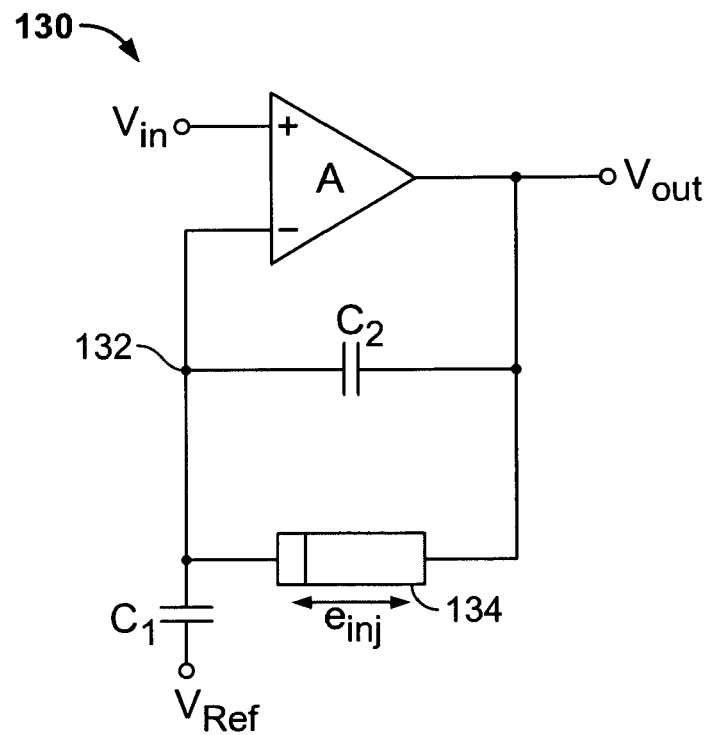

Turning now to FIG. 17, another specific implementation 130 is illustrated. In this single-ended, non-inverting embodiment, $V_{out}/V_{in}=1+C_{in}/C_{FB}$. Floating node 132 is coupled to the inverting input of operational amplifier A. Capacitor $C_1$ couples $V_{Ref}$ to floating node 132. Capacitor $C_2$ is disposed between floating node 132 and the $V_{out}$ node. A bi-directional CTD 134 is disposed in parallel with $C_2$. The $V_{in}$ input signal is coupled to the non-inverting input of the operational amplifier gain element A. The feedback action forces the floating node 132 to become equal to the $V_{in}$ input signal.

Figure 18:
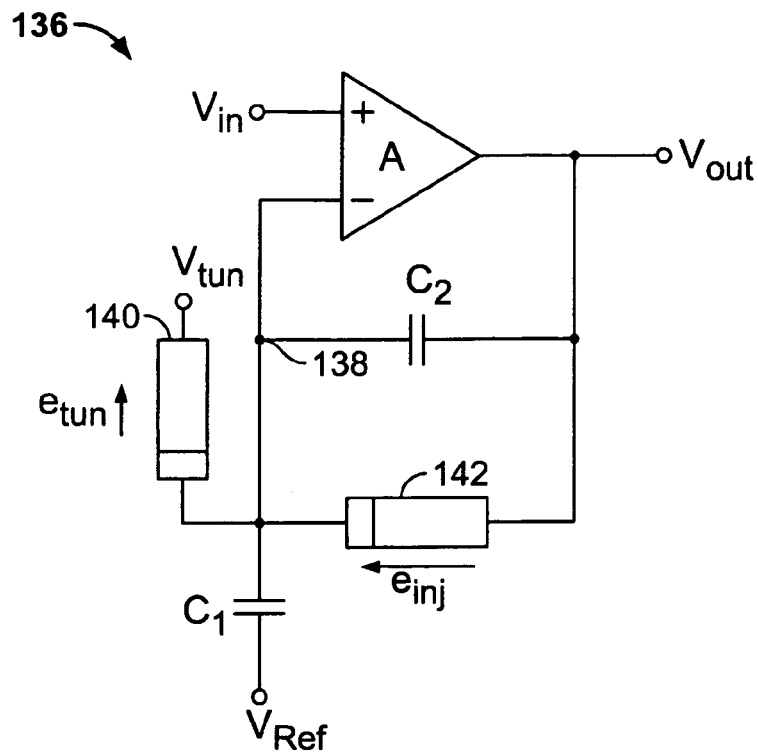

Turning now to FIG. 18, another specific implementation 136 is illustrated. In this single-ended, non-inverting embodiment, $V_{out}/V_{in}=1+C_{in}/C_{FB}$. In this embodiment gain element A is an operational amplifier with its non-inverting input coupled to the $V_{in}$ input signal node and its inverting input coupled to floating node 138. Capacitor C1 couples $V_{Ref}$ to floating node 138. Capacitor $C_2$ is disposed between floating node 138 and the $V_{out}$ node. A pair of unidirectional CTDs 140 and 142 are respectively disposed to remove and add electrons from/to floating node 138, as shown. The feedback action forces the floating node 138 to become equal to the $V_{in}$ input signal.

Figure 19:
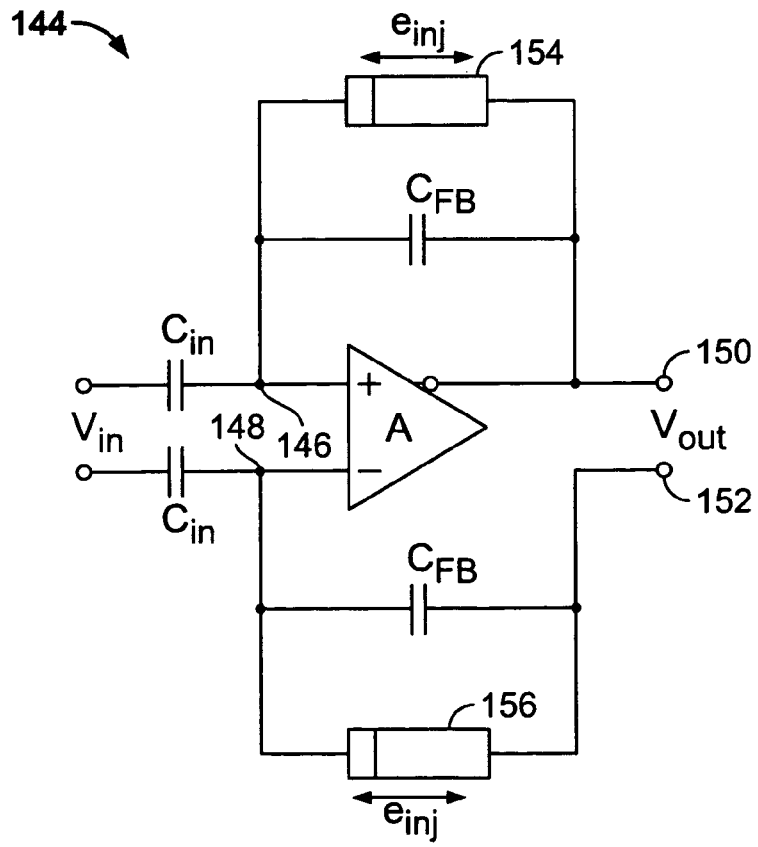

Turning now to FIG. 19, a differential embodiment 144 of the present invention is illustrated. In this differential embodiment $V_{out}/V_{in}=-C_{in}/C_{FB}$. A pair of capacitors $C_{in}$ couples the differential $V_{in}$ signal to the respective inputs of the gain element A, a differential output operational amplifier via first floating node 146 and second floating node 148, respectively. The circuit is symmetric and the "upper" components are the same as their corresponding "lower" components. A feedback capacitor $C_{FB}$ is disposed between floating node 146 and first differential output 150 and between second floating node 148 and second differential output 152. In parallel with first $C_{FB}$ is disposed bi-directional CTD 154 and in parallel with second $C_{FB}$ is disposed bi-directional CTD 156.

Figure 20:
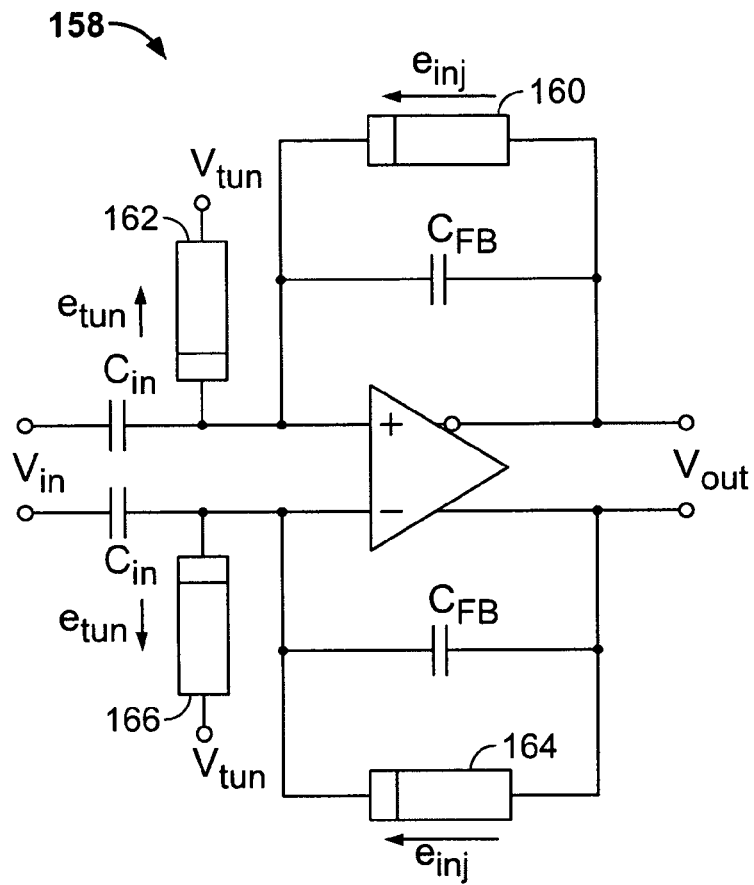

FIG. 20 illustrates a modification 158 of the circuit of FIG. 19 where bi-directional CTDs 154 and 156 have been replaced, respectively, with injection device 160 and tunneling device 162 and injection device 164 and tunneling device 166.

Figure 21:
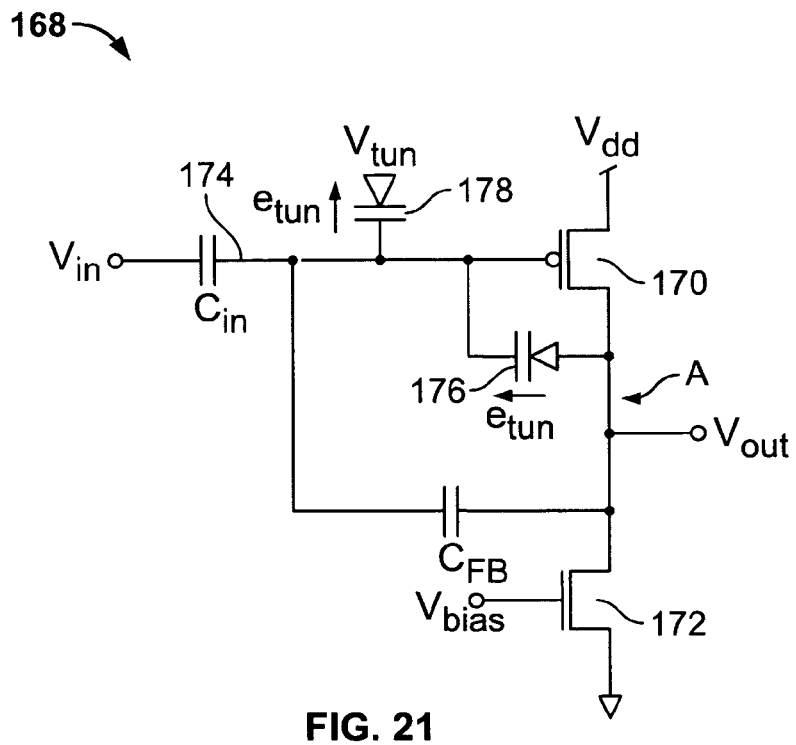

Turning now to FIG. 21, a single-ended, inverting embodiment 168 of the present invention implements $V_{out}/V_{in}=-C_{in}/C_{FB}$. In this embodiment the gain element is a CMOS inverter formed by pFET 170 and nFET 172 disposed in series with their sources tied respectively to $V_{dd}$ and ground and their drains tied to the $V_{out}$ node. Floating node 174 is coupled through $C_{in}$ to the input signal node $V_{in}$. $C_{FB}$ is disposed between floating node 174 and the $V_{out}$ node. Electrons are added to floating node 174 with CTD 176 and removed with CTD 178. CTDs 176 and 178 may implement FN, direct or FP tunneling. IHEI may be used to add electrons in CTD 176 or, with a suitably thin dielectric, direct tunneling may be used instead. $V_{bias}$ is applied to the gate of nFET 172. nFET 172 may be replaced with any appropriate current source. The gate of pFET 170 is coupled to floating node 174.

Figure 22:
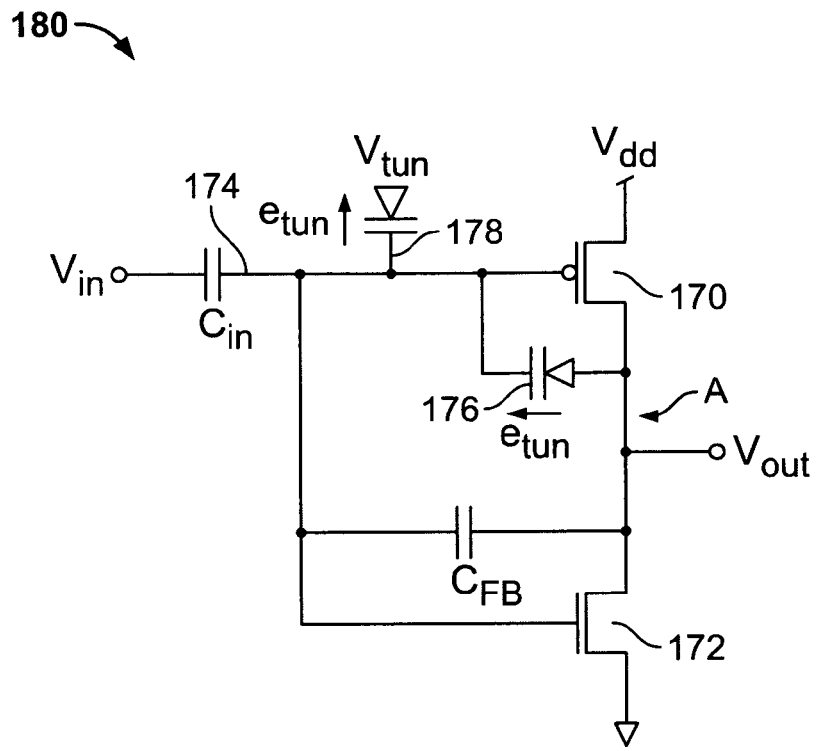

Turning now to FIG. 22, a single-ended, inverting embodiment 180 differs from embodiment 168 of FIG. 21 in that the gate of nFET 172 is coupled to floating node 174 instead of to $V_{bias}$ in order to provide increased gain.

Figure 23:
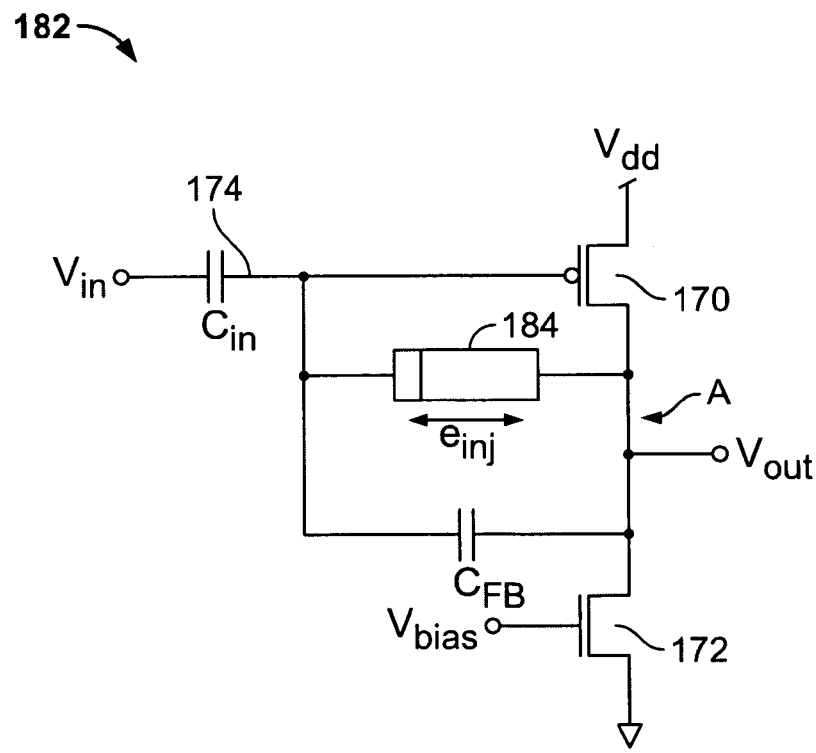

Turning now to FIG. 23, a single-ended, inverting embodiment 182 differs from embodiment 168 of FIG. 21 in that unidirectional CTDs 176 and 178 are replaced with bi-directional CTD 184.

Figure 24:
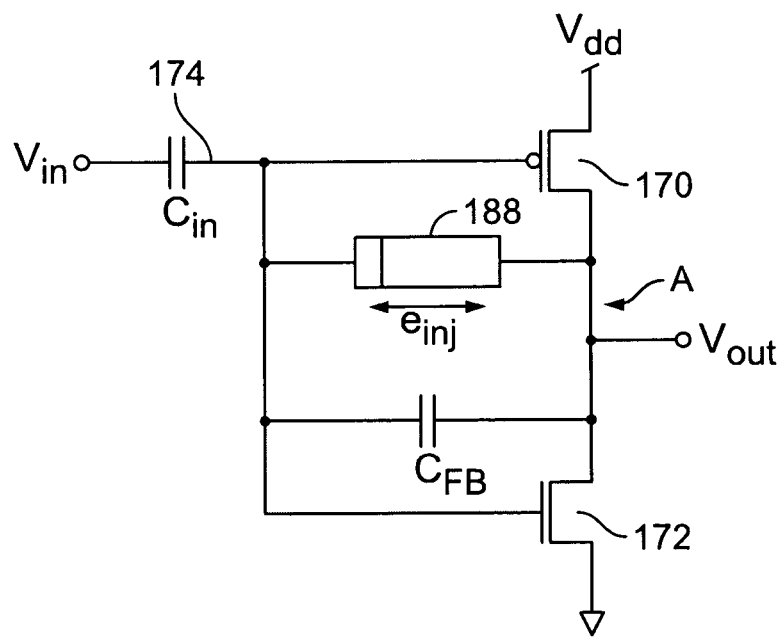

Turning now to FIG. 24, a single-ended, inverting embodiment 186 differs from embodiment 180 of FIG. 22 in that unidirectional CTDs 176 and 178 are replaced with bi-directional CTD 188.

Figure 25:
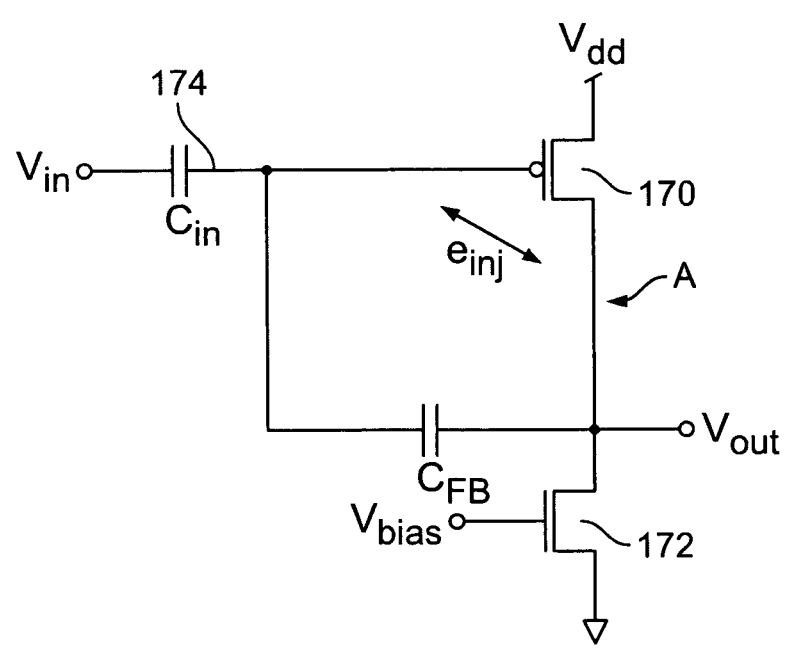

Turning now to FIG. 25, a single-ended, inverting embodiment 190 differs from embodiment 182 of FIG. 23 in that explicit CTD 184 is deleted and pFET 170 serves as a bi-directional CTD to both add and remove electrons from floating node 174. pFET 170 has a thin gate oxide which allows various forms of tunneling, as desired. $C_{FB}$ can also act as a CTD if implemented as a thin oxide capacitor.

Figure 26:
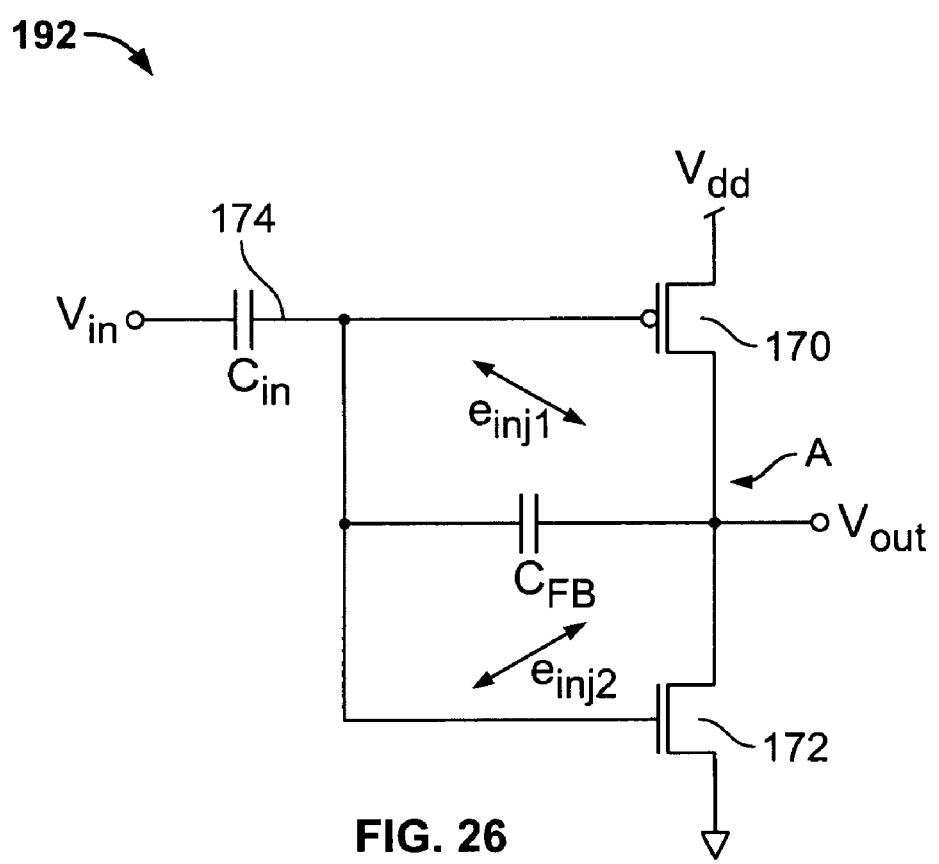

Turning now to FIG. 26, a single-ended, inverting embodiment 192 differs from embodiment 186 of FIG. 24 in that explicit CTD 188 is deleted and pFET 170 and/or nFET 172 act as uni- or bi-directional CTDs to transfer electrons to and from floating node 174. pFET 170 and nFET 172 have a thin gate oxide which allows various forms of tunneling, as desired. $C_{FB}$ can also act as a CTD if implemented as a thin oxide capacitor. All of pFET 170, nFET 172 and $C_{FB}$ may be bidirectional, if desired. Where some device dielectrics are implemented as thick oxide and others are relatively thin oxide, the thin oxide CTDs will dominate the tunneling. Note that thick oxide FETs will reduce the power dissipation caused by tunneling leakage current.

Using an OTA rather than the inverter taught in U.S. Pat. No. 5,875,126 provides the advantage that the bias for the amplifier is separate from the tunneling and injection mechanisms. In this manner, the AFGA's high frequency characteristics may be independently adjusted without affecting the low-frequency corner of the circuit's high-pass frequency response.

Using bi-directional tunneling to inject electrons onto the floating gate provides the advantage that the adaptation rates for voltage steps in either the positive or negative direction will be more closely matched than by using the different mechanisms of IHEI to add electrons and FN tunneling to remove electrons from the floating node as taught in U.S. Pat. No. 5,875,126. Using bi-directional tunneling can also eliminate the need for voltages outside the supply rails, as are required for IHEI or FN tunneling with thicker oxides.

While embodiments and applications of this invention have been shown and described, it would be apparent to those skilled in the art having the benefit of this disclosure that many more modifications than mentioned above are possible without departing from the inventive concepts herein.

For example, it is to be noted that while aspects of the present invention may be implemented in a single well, single poly process and will work with low voltage processes (e.g., <=3 Volts), the invention is not so limited and can be implemented in processes that support multiple polysilicon layers, multiple wells, and/or in higher (or lower) voltage devices.

Furthermore, the concept of an n-well as used herein is intended to encompass not only conventional n-well devices, but also NLDD (N-type Lightly Doped Drain) devices and other lightly doped, or isolated structures that increase the reliable gate-drain and drain-source voltages of the device so that it, in effect, behaves like a conventional n-well device in this respect. It may also be implemented in thin film above the substrate with equivalent thin film structures. The invention, therefore, is not to be restricted except in the spirit of the appended claims.

What is claimed is:

1. An autozeroing floating gate amplifier, comprising:
   a floating node;
   at least one input capacitively coupled to said floating node;
   an output node;
   a feedback capacitor coupled between said floating node and said output node;
   a charge transfer device having an insulating terminal coupled to said floating node and a control terminal coupled to said output node, said charge transfer device adapted to transfer charge to said floating node in response to a signal on said output node; and
   a gain device having an input coupled to said floating node and an output coupled to said output node.

2. The amplifier of claim 1, wherein said gain device comprises an inverter.

3. The amplifier of claim 1, wherein said gain device comprises an operational amplifier.

4. The amplifier of claim 1, wherein said gain device comprises an operational transconductance amplifier.

5. The amplifier of claim 1, wherein said floating node comprises the floating gate of a pFET.

6. The amplifier of claim 1, wherein said charge transfer device comprises separate elements for (1) transferring electrons to said floating node, and (2) transferring electron from said floating node.

7. The amplifier of claim 6, wherein said separate elements operate simultaneously.

8. The amplifier of claim 1, wherein said charge transfer device comprises a single element for bi-directionally transferring electrons to and from said floating node.

9. The amplifier of claim 1, wherein these are a plurality of inputs capacitively coupled to said floating node.

10. An autozeroing floating gate amplifier, comprising:
    means for storing charge;
    input means for receiving input signal capacitively coupled to said means for storing charge;
    output means for outputting a signal;
    feedback means coupled between said means for storing charge and said output means;
    charge transfer means coupled to said means for storing charge for transferring charge to the means for storing charge responsive to said output means; and
    amplification means for amplifying a signal, said amplification means having an input coupled to said means for storing charge and an output coupled to said charge transfer means and to said output means.

11. The amplifier of claim 10, wherein said amplification means comprises an inverter.

12. The amplifier of claim 10, wherein said amplification means comprises an operational amplifier.

13. The amplifier of claim 10, wherein said amplification means comprises an operational transconductance amplifier.

14. The amplifier of claim 10, wherein said means for storing charge comprises a floating gate of a pFET.

15. The amplifier of claim 10, wherein said charge transfer means includes separate means for transferring electrons to said means for storing charge and means for transferring electrons from said means for storing charge.

16. The amplifier of claim 10, wherein said charge transfer means includes means for bi-directionally transferring electrons to and from said means for storing charge.

17. The amplifier of claim 10, wherein there are a plurality of said input means.

* * * * *